(12) United States Patent
Ni et al.

(10) Patent No.: US 6,229,264 B1
(45) Date of Patent: May 8, 2001

(54) PLASMA PROCESSOR WITH COIL HAVING VARIABLE RF COUPLING

(75) Inventors: Tiqiang Ni; Wenli Collison, both of Fremont; John P. Holland, San Jose, all of CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/281,807

(22) Filed: Mar. 31, 1999

(51) Int. Cl.[7] .............................. H01J 7/24; H05B 31/26
(52) U.S. Cl. ................... 315/111.51; 315/111.81; 118/723 AN; 118/723 I
(58) Field of Search .......................... 315/111.51, 111.21, 315/111.81, 111.91; 118/723 AN, 723 I, 723 IR; 156/345; 219/121.48

(56) References Cited

U.S. PATENT DOCUMENTS

| | | |
|---|---|---|
| 1,037,402 | 9/1912 | Zehendner . |
| 2,341,387 | 2/1944 | Riddell ..................................... 95/64 |
| 2,439,330 | 4/1948 | Zander ................................. 177/329 |
| 2,695,547 | 11/1954 | Zander ..................................... 88/61 |
| 4,948,458 | 8/1990 | Ogle ..................................... 156/643 |
| 4,974,001 | 11/1990 | Watanabe et al. ................... 354/274 |
| 5,226,967 | 7/1993 | Chen et al. ........................... 118/723 |
| 5,277,751 | 1/1994 | Ogle ..................................... 156/643 |
| 5,304,279 | 4/1994 | Coultas et al. ....................... 156/345 |
| 5,368,710 | 11/1994 | Chen et al. ....................... 204/192.32 |
| 5,401,350 | 3/1995 | Patrick et al. ........................ 156/345 |
| 5,690,781 | * 11/1997 | Yoshida et al. .................. 315/111.51 |
| 5,731,565 | 3/1998 | Gates ............................... 219/121.43 |
| 5,759,280 | 6/1998 | Holland et al. .................... 118/723 I |
| 5,800,619 | * 9/1998 | Holland et al. ................. 118/723 IR |
| 5,874,704 | 2/1999 | Gates ............................... 219/121.54 |

FOREIGN PATENT DOCUMENTS

| | | |
|---|---|---|
| 0607797 | 7/1994 | (EP) . |
| 0813227 | 12/1997 | (EP) . |
| 0820086 | 1/1998 | (EP) . |
| 0838839 | 4/1998 | (EP) . |
| WO9716946 | 5/1997 | (WO) . |

* cited by examiner

Primary Examiner—Michael B. Shingleton
(74) Attorney, Agent, or Firm—Lowe Hauptman Gilman & Berner, LLP

(57) ABSTRACT

A coil for exciting an r.f. plasma in a vacuum plasma processing chamber includes plural radially and circumferentially extending turns connected between a pair of r.f. excitation terminals. In one embodiment, a drive mechanism varies r.f. field coupling coefficients between different radial and circumferential portions of the coil and the plasma. The drive mechanism includes plural drive shafts which drive different portions of the coil toward and away from the plasma. In a second embodiment, the drive mechanism drives an r.f. shield having at least one moving part for intercepting a portion of an r.f. plasma excitation field derived by the coil.

28 Claims, 3 Drawing Sheets

PLASMA PROCESSOR WITH COIL HAVING VARIABLE RF COUPLING

FIELD OF THE INVENTION

The present invention relates generally to plasma processors including radio frequency (r.f.) responsive coils for exciting gases in vacuum chambers to plasmas that process workpieces in the chamber and more particularly to such a processor and to a processing method wherein plasma density on the workpiece is controlled by varying coupling coefficients of r.f. fields between different positions of the coil and the plasma, and to such a coil.

BACKGROUND ART

One type of processor for treating workpieces with an r.f. plasma in a vacuum chamber includes a coil responsive to an r.f. source. The coil responds to the r.f. source to produce magnetic and electric fields that excite ionizable gas in the chamber to a plasma. Usually the coil is on or adjacent to a dielectric window that extends in a direction generally parallel to a planar horizontally extending surface of the processed workpiece. The excited plasma interacts with the workpiece in the chamber to etch the workpiece or to deposit material on it, i.e., to process the workpiece. The workpiece is typically a semiconductor wafer having a planar circular surface or a solid dielectric plate, e.g., a rectangular glass substrate used in flat panel displays, or a metal plate.

Ogle, U.S. Pat. No. 4,948,458 discloses a multi-turn spiral coil for achieving the above results. The spiral, which is generally of the Archimedes type, extends radially and circumferentially between its interior and exterior terminals connected to the r.f. source via an impedance matching network. Coils of this general type produce oscillating r.f. fields having magnetic and capacitive field components that propagate through the dielectric window to heat electrons in the gas in a portion of the plasma in the chamber close to the window. The oscillating r.f. fields induce in the plasma currents that heat electrons in the plasma. The spatial distribution of the magnetic field in the plasma portion close to the window is a function of the sum of individual magnetic field components produced by each turn of the coil. The magnetic field component produced by each of the turns is a function of the magnitude of r.f. current in each turn which differs for different turns because of transmission line effects of the coil at the frequency of the r.f. source.

For spiral designs as disclosed by and based on the Ogle '458 patent, the r.f. currents in the spiral coil are distributed to produce a torroidal shaped magnetic field region in the portion of the plasma close to the window, which is where power is absorbed by the gas to excite the gas to a plasma. At low pressures, in the 1.0 to 10 mTorr range, diffusion of the plasma from the ring shaped region produces plasma density peaks just above the workpiece in central and peripheral portions of the chamber, so the peak densities of the ions and electrons which process the workpiece are in proximity to the workpiece center line and workpiece periphery. At intermediate pressure ranges, in the 10 to 100 mTorr range, gas phase collisions of electrons, ions, and neutrons in the plasma prevent substantial diffusion of the plasma charged particles outside the torroidal region. As a result, there is a relatively high plasma flux in a ring like region of the workpiece but low plasma fluxes in the center and peripheral workpiece portions.

These differing operating conditions result in substantially large plasma flux (i.e., plasma density) variations between the ring and the volumes inside and outside of the ring, resulting in a substantial standard deviation, i.e., in excess of three, of the plasma flux incident on the workpiece. The substantial standard deviation of the plasma flux incident on the workpiece has a tendency to cause non-uniform workpiece processing, i.e, different portions of the workpiece are etched to different extents and/or have different amounts of molecules deposited on them.

Many coils have been designed to improve the uniformity of the plasma. The commonly assigned U.S. Pat. No. 5,759,280, Holland et al., issued Jun. 2, 1998, discloses a coil which, in the commercial embodiment, has a diameter of 12 inches and is operated in conjunction with a vacuum chamber having a 14.0 inch inner wall circular diameter. The coil applies magnetic and electric fields to the chamber interior via a quartz window having a 14.7 inch diameter and 0.8 inch uniform thickness. Circular semiconductor wafer workpieces are positioned on a workpiece holder about 4.7 inches below a bottom face of the window so the center of each workpiece is coincident with a center line of the coil.

The coil of the '280 patent produces considerably smaller plasma flux variations across the workpiece than the coil of the '458 patent. The standard deviation of the plasma flux produced by the coil of the '280 patent on a 200 mm wafer in such a chamber operating at 5 milliTorr is about 2.0, a considerable improvement over the standard deviation of approximately 3.0 for a coil of the '458 patent operating under the same conditions. The coil of the '280 patent causes the magnetic field to be such that the plasma density in the center of the workpiece is greater than in an intermediate part of the workpiece, which in turn exceeds the plasma density in the periphery of the workpiece. The plasma density variations in the different portions of the chamber for the coil of the '280 patent are much smaller than those of the coil of the '458 patent for the same operating conditions as produce the lower standard deviation.

Other arrangements directed to improving the uniformity of the plasma density incident on a workpiece have also concentrated on geometric principles, usually concerning coil geometry. See, e.g., U.S. Pat. Nos. 5,304,279, 5,277,751, 5,226,967, 5,368,710, 5,800,619, 5,731,565, 5,401,350, and 5,847,704.

To our knowledge all generally available prior art coils have fixed spatial geometries even though different processes have different recipes requiring differing chamber parameters. The different recipes are associated with different processes performed on the workpiece. The chamber parameters for a particular recipe in the past have generally been limited to gas flow rate, vacuum pressure, gas species, r.f. power applied to the excitation coil and r.f. power applied to an electrode of an electrostatic chuck to produce what is referred to in the art as r.f. bias. Control of a further parameter affecting the plasma while a workpiece is processed in the same chamber is desirable. In addition, sometimes it is desirable to change the r.f. fields the coil couples to the plasma as a function of time during the same recipe step.

While uniform plasma density is usually desirable, there are applications in which it is desirable for the plasma flux density to differ on different parts of the workpiece during a particular processing step. There are other situations where the plasma density desirably has a first particular desired non-uniformity characteristic during a first processing step, i.e., while a first recipe is being performed, and has a second particular desired non-uniformity characteristic during a second processing step. To our knowledge, there is no generally available prior art or method of or apparatus for achieving these types of results in the same processing chamber.

It is accordingly an object of the present invention to provide a new and improved vacuum plasma processor and method of operating same wherein the plasma density incident on the workpiece has relatively high uniformity.

Another object of the invention is to provide a new and improved vacuum plasma processor having an r.f. coil with the same geometry as the prior art coil but which is coupled to the plasma in such a way as to enable the plasma to have relatively high density uniformity characteristics.

A further object of the invention is to provide a new and improved vacuum plasma processor method and apparatus wherein an r.f. excitation coil is arranged so different portions of the coil have differing, changeable r.f. coupling coefficients with the plasma.

An additional object of the invention is to provide a new and improved plasma processor having increased flexibility in establishing processing conditions.

Yet another object of the invention is to provide a new and improved plasma processor wherein the same processing chamber can be used to obtain different desired spatial relations of plasma density.

SUMMARY OF THE INVENTION

In accordance with one aspect of the present invention, a coil for exciting an r.f. plasma in a vacuum plasma processing chamber comprises plural radially and circumferentially extending turns connected between a pair of r.f. excitation terminals, and a drive arrangement for varying r.f. field coupling coefficients between different radial and circumferential portions of the coil and the plasma.

Another aspect of the invention relates to a method of controlling an r.f. plasma treating one or more workpieces on a workpiece holder in a vacuum plasma processing chamber. The method is performed in accordance with plural recipes each including a set of parameters. The parameters for each recipe include (a) flow rate of the gas supplied to the chamber and the gas specie supplied to the chamber for the recipe, (b) pressure in the chamber, (c) power supplied to a multi-turn excitation coil for the plasma, and (c) a function determined by a desired coupling coefficient of r.f. field components the coil is to apply to different portions of the plasma. The method includes processing a workpiece in accordance with a first of the recipes with the coupling coefficient adjusted so there is a first relation between field components derived from different portions of the coil and the plasma, and thereafter processing a workpiece in accordance with a second of the recipes with the coupling coefficient adjusted so there is a second relation between field components derived from different portions of the coil and the plasma. The workpiece processed in accordance with the first and second recipes can be the same or different workpieces.

In one embodiment the varying arrangement drives different portions of the coil toward and away from the plasma to space the different coil portions by differing amounts from the plasma. In a second embodiment the varying arrangement includes a shield having at least one moving part for intercepting a portion of a plasma excitation field derived by the coil and for preventing coupling of the intercepted field portion to the plasma. A drive moves the shield moving part portion relative to the coil and plasma so different positions of the shield cause different amounts of coupling of the plasma excitation field to the plasma from different portions of the coil.

In the preferred embodiment a controller for the processor includes a memory storing plural recipes for different processing steps of at least one workpiece that is processed by the processor. Each recipe includes set points of various parameters of the processor. The set points are for (a) flow rate of gas into the processor chamber, (b) vacuum pressure in the processor chamber, (c) power applied to the coil and (d) position of the drive member. The controller responds to the stored set point signals to control (a) flow rate of gas into the processor chamber, (b) vacuum pressure in the processor chamber, (c) power applied to the coil and (d) position of the drive member to control the r.f. coupling coefficient.

The above and still further objects, features and advantages of the present invention will become apparent upon consideration of the following detailed descriptions of several specific embodiments thereof, especially when taken in conjunction with the accompanying drawings.

DETAILED DESCRIPTION OF THE DRAWING

Figure 1:
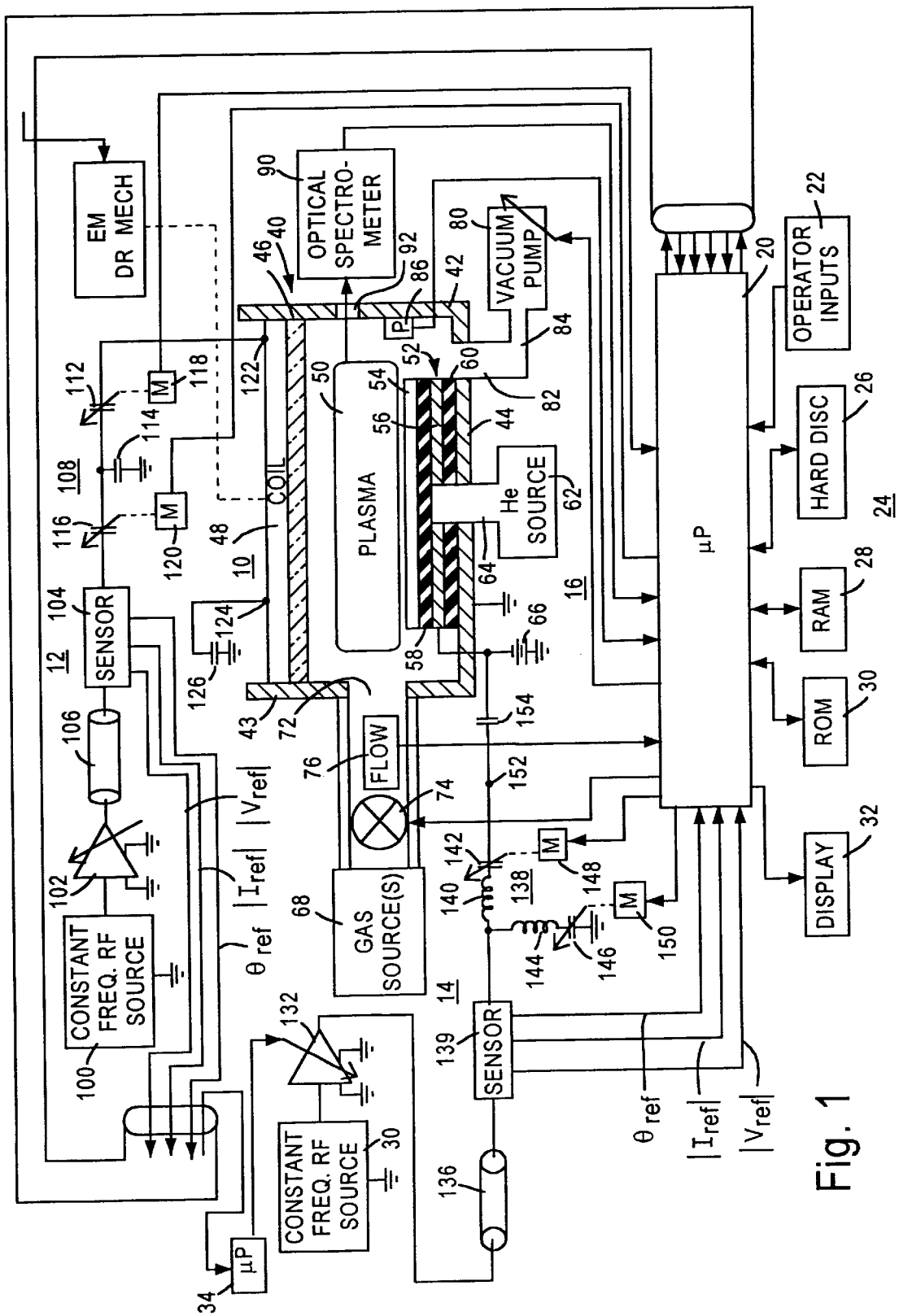
FIG. 1 is a schematic diagram of a vacuum plasma processor including an arrangement for varying the coupling coefficient of r.f. fields a coil supplies to a plasma in a processing chamber.

The workpiece processor illustrated in FIG. 1 includes vacuum plasma processing chamber assembly 10, excitation circuitry 12 for driving a coil for exciting ionizable gas in chamber assembly 10 to a plasma state, a second circuit 14 for applying r.f. bias to a workpiece holder in chamber assembly 10 and a controller arrangement 16 responsive to sensors for various parameters associated with chamber assembly 10 for deriving control signals for devices affecting the plasma in chamber assembly 10. Controller 16 includes microprocessor 20 which responds to various sensors associated with chamber 10 as well as circuits 12 and 14 and signals from operator inputs 22, which can be in the form, for example, of a keyboard. Microprocessor 20 is coupled with memory system 24 including hard disk 26, random access memory (RAM) 28 and read only memory (ROM) 30. Microprocessor 20 responds to the various signals supplied to it to drive display 32, which can be a typical computer monitor.

Hard disk 26 and ROM 30 store programs for controlling the operation of microprocessor 20 and preset data associated with different recipes for the processes performed in chamber 10. The different recipes concern gas species and flow rates applied to chamber assembly 10 during different processes, the output power of a.c. sources included in circuits 12 and 14, the vacuum applied to the interior of chamber 10, initial values of variable reactances included in matching networks of circuits 12 and 14, and coupling coefficients data for r.f. fields the coil supplies to the plasma in chamber assembly 10.

Plasma chamber assembly 10 for processing workpiece 54 includes chamber 40 having metal, non-magnetic cylindrical side wall 42, non-magnetic metal shield collar 43 that extends above wall 42, and metal non-magnetic base 44, all of which are electrically grounded. Dielectric, typically quartz, window 46 is fixedly positioned between the top edge of wall 42 and collar 43. Wall 42, base 44 and window 46 are rigidly connected to each other by suitable gaskets to enable a vacuum to be established within the interior of chamber 40. Plasma excitation coil 48 has radially and circumferentially extending turns, for example, a spiral configuration similar to that disclosed in Ogle, U.S. Pat. No. 4,948,458 or a configuration as disclosed in Holland et al. U.S. Pat. No. 5,759,280. Coil 48 sits in very close proximity to the upper face of window 46. Coil 46 reactively supplies magnetic and electric fields to the interior of chamber 40, to excite ionizable gas in the chamber to plasma, schematically illustrated in FIG. 1 by reference numeral 50.

Electromechanical drive mechanism 49, associated with coil 48, responds to one or more signals microprocessor 20 derives for each recipe to control r.f. field coupling coefficients of r.f. fields coil 48 supplies to plasma 50. The coupling coefficients are variable as a function of coil radial and circumferential position. The coupling coefficients for different recipes adjust the magnitude of r.f. magnetic and electrostatic fields different portions of coil 48 supply to plasma 50.

The different coupling coefficients can enable plasma density uniformity on workpiece 54 to be achieved for the different recipes, e.g., for main and over etch steps on the same workpiece. The main and over etch steps are usually performed in response to recipes in memory system 24 that cause microprocessor 20 to control pump 80 so the pressures in chamber 40 are respectively 10 milliTorr and 60 milliTorr. Because of these differing pressures the spatial distribution of plasma density on workpiece 54 has a tendency to differ for different parts of the workpiece. Drive mechanism 49 responds to the signal(s) from microprocessor 20 to change the r.f. coupling coefficient between different parts of coil 48 and plasma 50 to attain a substantially uniform plasma flux on workpiece 48 for these two different pressures. Similarly, memory 24 stores data associated with different field coupling coefficients for different gas species source 68 supplies to the interior of chamber 40 to attain a substantially uniform plasma density on workpiece 48. (While only one source is illustrated in FIG. 1, it is to be understood that more than one source can be included and the recipes control which gas sources supply gas to chamber 40.) In addition, memory 24 can store data associated with different field coupling coefficients for certain desired non-uniform spatial relations for plasma density on workpiece 54.

Figure 2:
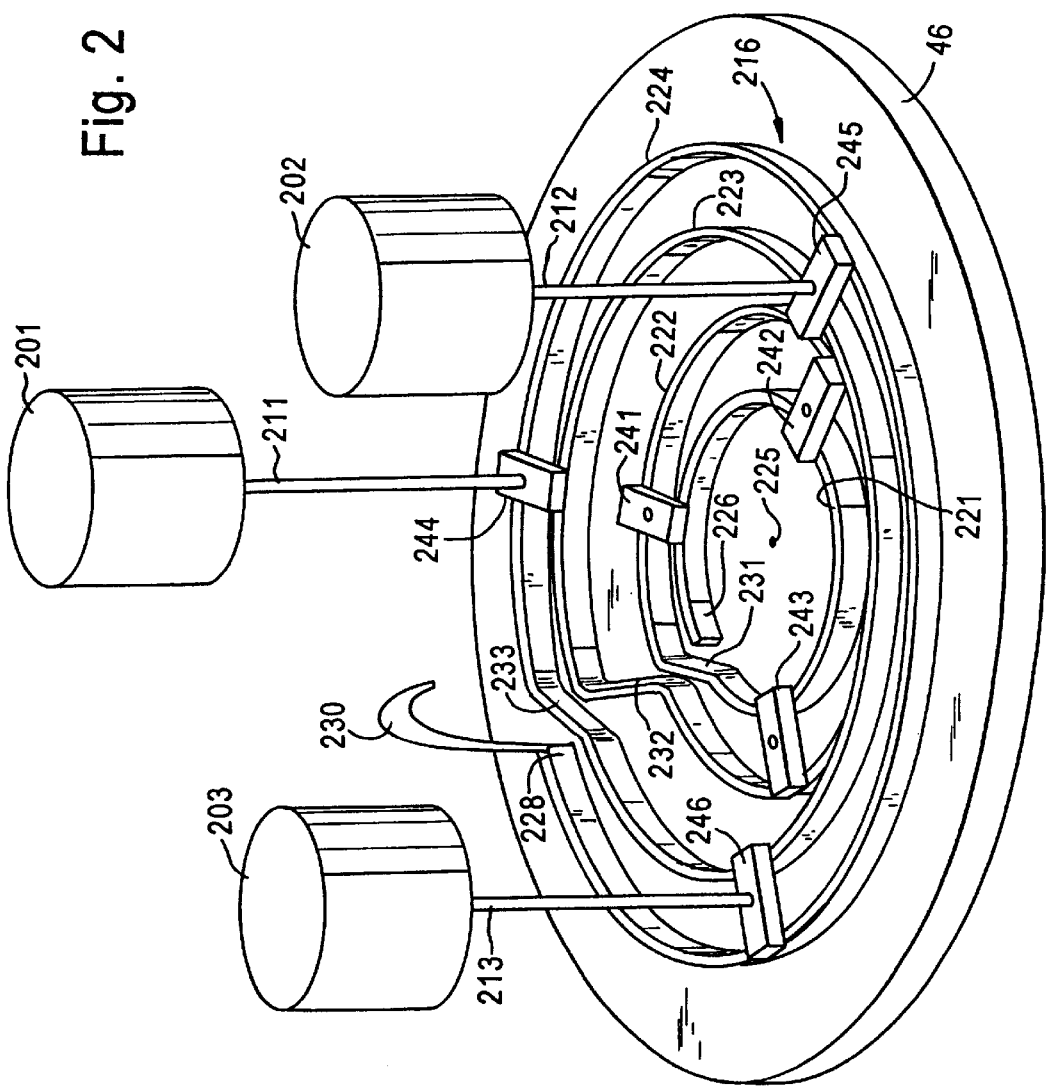
FIG. 2 is a perspective view of a first preferred embodiment of a mechanism for varying the coupling coefficient by changing the spacing of different portions of the coil relative to the plasma.

In one embodiment, described in detail infra in connection with FIG. 2, drive mechanism 49 includes plural electric or pneumatic motors having shafts for driving different portions of coil 48 to different heights above window 46, i.e., the motors drive different radial and circumferential parts of coil 48 to differing distances from plasma 50. Memory 24 stores signals indicative of the desired position, relative to window 46, of the shaft of each motor for each recipe. Microprocessor 20 responds to the signals from memory 24 to derive motor control signals for the motor shafts.

In a second embodiment described in detail in connection with FIG. 3, drive mechanism 49 includes one shaft for opening and closing a metal iris positioned between coil 48 and window 49. The iris is an r.f. shield for attenuating r.f. fields coil 48 derives to control the magnitude of r.f. fields different parts of coil 48 supply to plasma 50. The iris preferably includes grounded non-magnetic metal leaves. In one arrangement the centers of the iris, coil 48 and chamber 40 are fixed and on the same axis. In another arrangement (not illustrated), which can employ a metal plate with a fixed inner diameter or an iris with a variable inner diameter, drive mechanism 49 includes at least two motors for driving the grounded shield relative to the center of coil 48, in a plane generally parallel to the face of window 46.

The upper face of bottom plate 44 carries workpiece holder 52 for workpiece 54, which is typically a circular semiconductor wafer, a rectangular dielectric plate such as used in flat panel displays or a metal plate. Workpiece holder 52 typically includes a metal plate electrode 56 which carries dielectric layer 58 and sits on dielectric layer 60, which is carried by the upper face of base 44. A workpiece handling mechanism (not shown) places workpiece 54 on the upper face of dielectric layer 58. Workpiece 54 is cooled by supplying helium from a suitable source 62 to the underside of dielectric layer 58 via conduit 64 and grooves (not shown) in electrode 56. With workpiece 54 in place on dielectric layer 58, d.c. source 66 supplies a suitable voltage through a switch (not shown) to electrode 56 to clamp, i.e., chuck, workpiece 54 to holder, i.e., chuck, 52.

With workpiece 54 secured in place on chuck 52, one or more ionizable gases from one or more sources 68 flow into the interior of chamber 40 through conduit 70 and port 72 in sidewall 42. For convenience, only one gas source 68 is included in FIG. 1. The interior of conduit 70 includes valve 74 and flow rate meter 76 for respectively controlling the flow rate of gas through port 72. Valve 74 responds to a signal microprocessor 20 derives, while gauge 76 supplies the microprocessor with an electric signal indicative of the gas flow rate through port 72. Memory system 24 stores for each recipe of a workpiece 54 processed in chamber 40 a desired gas flow rate in conduit 70. Microprocessor 20 responds to the stored signal for desired flow rate and the monitored flow rate gate 76 derives to control valve 74 accordingly.

Vacuum pump 80, connected to port 82 in base 44 of chamber 40 by conduit 84, evacuates the interior of the chamber to a suitable pressure, typically in the range of one to one hundred milliTorr. Pressure gauge 86 in the interior of chamber 40 supplies microprocessor 20 with a signal indicative of the vacuum pressure in chamber 40.

Memory system 24 stores a desired vacuum pressure in the interior of chamber 40. Microprocessor 20 responds to the stored desired pressure signal memory system 24 derives for each recipe and an electric signal from pressure gauge 86 to supply an electric signal to vacuum pump 80 to maintain the pressure in chamber 40 at the set point or predetermined value for each recipe.

Optical spectrometer 90 monitors the optical emission of plasma 50 by responding to optical energy emitted by the plasma and coupled to the spectrometer via window 92 in side wall 42. Spectrometer 90 responds to the optical energy emitted by plasma 50 to supply an electric signal to microprocessor 20. Microprocessor 20 responds to the signal spectrometer 90 derives to detect an end point of the process (either etching or deposition) plasma 50 is performing on workpiece 54. Microprocessor 20 responds to the signal spectrometer 90 derives and a signal memory system 24 stores indicative of a characteristic of the output of spectrometer 90 associated with an end point to supply the memory with an appropriate signal to indicate that the recipe has been completed. Microprocessor 20 then responds to signals from memory system 24 to stop certain activities associated with the completed recipe and initiate a new recipe on the workpiece previously processed in chamber 40 or commands release of workpiece 54 from chuck 52 and transfer of a new workpiece to the chuck, followed by instigation of another series of processing recipes.

Excitation circuit 12 for driving coil 48 includes constant frequency r.f. source 100, typically having a frequency of 13.56 mHz. Source 100 drives variable gain power amplifier 102, typically having a power output of anywhere in the range between 100 and 3000 watts. Amplifier 102 typically has a 50 ohm output impedance, all of which is resistive and none of which is reactive. Hence, the impedance seen looking back into the output terminals of amplifier 102 is typically represented by (50+j0).

For any particular recipe, memory system 24 stores a signal for desired output power of amplifier 112. Memory system 24 supplies the signal for desired output power of amplifier 102 to the amplifier by way of microprocessor 20. The output power of amplifier 102 can be controlled in an open loop manner in response to the signals stored in memory system 24 or control of the output power of amplifier 102 can be on a closed loop feedback basis.

The output power of amplifier 102 drives coil 48 via cable 106 and matching network 108. Matching network 108 has a "T" configuration, including two series legs respectively including variable capacitors 112 and 116, as well as a shunt leg including fixed capacitor 114. Coil 48 includes input and output terminals 122 and 124, respectively connected to one electrode of capacitor 112 and to a first electrode of series capacitor 126, having a grounded second electrode. The value of capacitor 126 is selected as described in the commonly assigned Barnes et al. and/or Holland et al., previously mentioned patent.

Electric motors 118 and 120, preferably of the step type, respond to signals from microprocessor 20 to control the values of capacitors 112 and 116 in relatively small increments to maintain an impedance match between the impedance seen by looking from the output terminals of amplifier 102 into cable 106 and by looking from cable 106 into the output terminals of amplifier 102. Hence, for the previously described (50+j0) ohm output impedance of amplifier 102, microprocessor 20 controls motors 118 and 120 so the impedance seen looking from amplifier 102 into directional coupler 104 is as close as possible to (50+j0) ohms.

To control motors 118 and 120 to maintain a matched condition for the impedance seen looking into the output terminals of amplifier 102 and the impedance amplifier 102 drives, microprocessor 20 responds to signals indicative of the reflected voltage and current cable 106 couples back to cable 106. Sensor 104 includes circuits (not shown) for deriving signals indicative of the reflected voltage and current and the phase angle between the reflected voltage and current. Alternatively, sensor 104 includes circuitry (not shown) for deriving signals indicative of the power amplifier 102 supplies to its output terminal and the power reflected by matching network 108 back to cable 106. Microprocessor 20 responds to output signals of sensor 104 to control motors 118 and 120 to attain the matched condition.

Because of variations in conditions in the interior of chamber 40 which affect plasma 50, the plasma has a variable impedance. The conditions are aberrations in the flow rate and species of the gas flowing through port 72, aberrations in the pressure in chamber 40 and other factors. In addition, noise is sometimes supplied to motors 118 and 120. All of these factors affect the impedance reflected by the load including plasma 50 back to the output terminals of amplifier 102. Microprocessor 20 responds to the output signals of the circuits included in sensor 104 to control motors 118 and 120 to vary the values of capacitors 112 and 116 to maintain the impedance driven by the output of amplifier 102 relatively constant.

Circuit 14 for supplying r.f. bias to workpiece 54 via electrode 56 has a construction similar to circuit 12. Circuit 14 includes constant frequency r.f. source 130, typically having a frequency such as 400 kHz, 2.0 mHz or 13.56 mHz. The constant frequency output of source 130 drives variable gain power amplifier 132, which in turn drives the cascaded arrangement including cable 136 and matching network 138. Matching network 138 includes a series leg comprising the series combination of fixed inductor 140 and variable capacitor 142, as well as a shunt leg including fixed inductor 144 and variable capacitor 146. Motors 148 and 150, which are preferably step motors, vary the values of capacitors 142 and 146, respectively, in response to signals from microprocessor 20.

Output terminal 152 of matching network 138 supplies an r.f. bias voltage to electrode 56 by way of series coupling capacitor 154 which isolates matching network 138 from the chucking voltage of d.c. source 66. The r.f. energy circuit 14 applies to electrode 56 is capacitively coupled via dielectric layer 48, workpiece 54 and a plasma sheath between the workpiece and plasma to a portion of the plasma in close proximity with chuck 52. The r.f. energy chuck 52 couples to plasma 50 establishes a d.c. bias in the plasma; the d.c. bias typically has values between 50 and 1000 volts. The d.c. bias resulting from the r.f. energy circuit 14 applies to electrode 52 accelerates ions in plasma 50 to workpiece 54.

Microprocessor 20 responds to signals derived by circuits (not shown) included in sensor 134 to control motors 148 and 150 and the values of capacitors 142 and 146 in a manner similar to that described supra with regard to control of capacitors 112 and 116 of matching network 108. Accordingly, the circuits included in sensor 134 derive signals indicative of the current and voltage cable 136 reflects back to the output terminals of amplifier 132, as well as the phase angle between the reflected voltage and current.

The r.f. coefficient coupling arrangement illustrated in FIG. 2 includes step motors 201, 202 and 203 respectively responsive to signals memory system 24 supplies to microprocessor 20 for each processing recipe of workpieces in chamber 40. Motors 201, 203 and 204 respond to the signals to drive lead screws 211, 212 and 213 in the vertical direction, i.e., toward and away from dielectric window 46. The ends of lead screws 211–213 are fixedly secured to different portions of spiral, radially and circumferentially extending coil (i.e., winding) 216, schematically illustrated in FIG. 1 as coil 48. (To simplify FIG. 2, shield 43 is not shown.) The signals microprocessor 20 supplies to motors 201–203 thus enable different portions of coil 216 to be moved by differing amounts relative to window 46 and plasma 50 in chamber 40.

Coil 216 includes four constant diameter electrically conducting turns 221–224, each preferably formed of a copper band. Turns 221–224 are concentric with center axis 225 of coil 216. Inner turn 221 includes interior terminal portion 226 connected by a fixed copper strap (not shown) to an output terminal of matching network 108 while outer turn 214 includes exterior terminal portion 228 connected to one electrode of capacitor 126 by flexible, upwardly extending conductor 230, preferably a copper braided strap. Radially and circumferentially extending electrically conducting metal (preferably copper) straps 231, 232 and 233 connect adjacent ends of turns 221–224 together.

Electrical insulating blocks 241–246, bonded to the top edges of the straps forming turns 221–224, rigidly connect adjacent pairs of the turns together. Blocks 241–243, which are spaced from each other by 120°, fixedly connect three different portions of inner turns 221–222 and blocks 244–246, which are respectively angularly aligned with blocks 241–243, fixedly connect outer turns 223 and 224. Fixed rods (not shown) fixedly mounted in a plate (not shown) fit into blocks 241–243 to prevent movement of blocks 241–243 relative to window 46 to thereby fixedly mount interior turns 221 and 222 relative to window 46. The plate carrying the rods that fit into blocks 241–243 also carries motors 201–203.

The ends of lead screws 211–213, respectively fixedly mounted to blocks 244–246, vertically drive blocks 244–246 and the portions of windings 223–224 connected to blocks 244–246. Radially extending winding portions 232–233, as well as the portions of turns 222, 223 and 224 abutting them are flexible, braided electrically conducting straps. As a result, the signals microprocessor 20 supplies to motors 201–203 cause outer turns 223 and 224 to be lifted and lowered relative to the top face of window 48.

Motors 201–203 can drive turns 223 and 224 so all portions of these turns are spaced above interior windings 221 and 222 and window 48 by the same distance. Alternatively, motors 201–203 can drive outer turns 223 and 224 SO these outer turns are tilted so that, e.g., (1) the parts of outer turns 223 and 224 connected to block 244 are closer to window 46 than the parts of these turns that are connected to block 245, and (2) the parts of turns 223 and 224 connected to block 246 are farther from window 48 than the parts of these outer turns connected to block 245.

Because of the differing distances of turns 223 and 224 from window 48 relative to turns 221 and 222, the r.f. field coupling coefficients between the different winding portions of coil 216 and the plasma differ. Hence, there is greater r.f. magnetic and electrostatic field coupling to the plasma from inner windings 221 and 222 than from outer windings 223 and 224. Controlling the r.f. field coupling between different portions of coil 216 and plasma 50 enables the desired previously described results to be attained.

Figure 3:
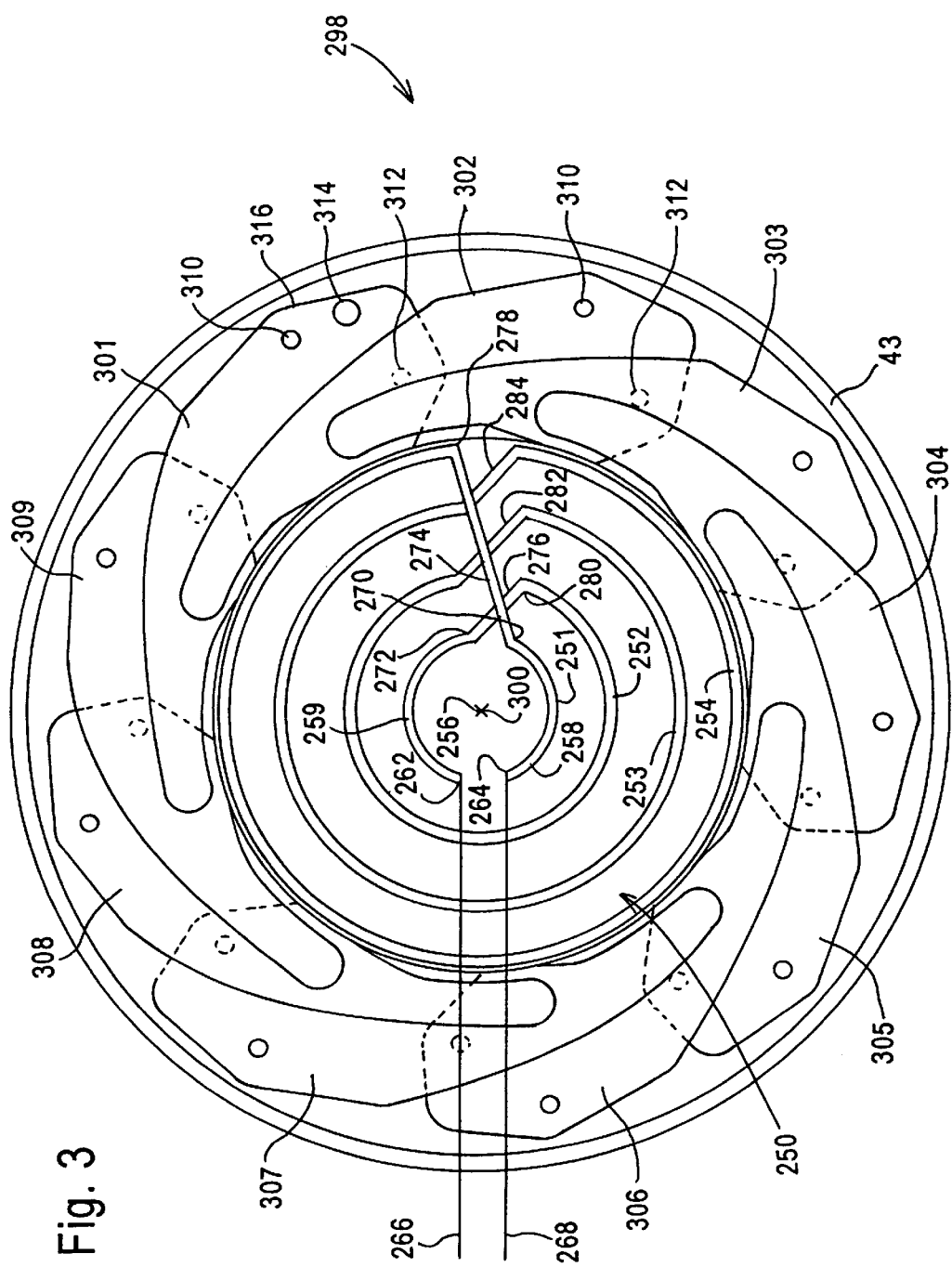
FIG. 3 is a top view of a second preferred embodiment of a mechanism for varying the coupling coefficient by changing the diameter of an iris of a shield located between the coil and plasma.

FIG. 3 is a top view of another embodiment for controlling the r.f. fields different portions of the excitation coil supplies to plasma 50. Coil 250 illustrated in FIG. 3, (schematically illustrated in FIG. 1 as coil 48) has the same configuration as the coil disclosed in commonly assigned Holland et al. U.S. Pat. No. 5,759,280.

In particular, coil 250 includes four concentric constant radius stationary turns 251, 252, 253, 254, which are electrically conducting (preferably copper) straps and are fixedly positioned relative to each other and window 46. Turns 251–254 have progressively increasing radii relative to central axis 256 of coil 250. Interior winding 251 includes two separate symmetrically positioned sections 258 and 259 having the same arcuate length. Sections 258 and 259 include interior terminals 262 and 264 connected by leads 266 and 268 to an output terminal of matching network 108 and one electrode of capacitor 126, respectively. Sections 258 and 259 also include terminals 270 and 272, connected by radially and circumferentially extending metal U-shaped bar 274 and straight strap 276 to terminal 278 of outermost turn 254 and to adjacent terminal 280 of turn 252, respectively. Radially and circumferentially extending straight metal straps 282 and 284 respectively connect adjacent terminals of turns 252 and 253 to each other and adjacent terminals of turns 253 and 254 to each other. Outer turn 254 is in relatively close proximity to the interior wall of sleeve shaped shield 43.

Electrically conducting, non-magnetic, grounded metal iris 298, positioned between the bottom edges of windings 251–254 and window 46, controls the coupling coefficients of r.f. electric and magnetic fields between coil 250 and plasma 50. Iris 298 has a central axis 300 coincident with central axis 256 of coil 250. Iris 298 includes nine identical metal (preferably copper) leaves 301–309, each including a somewhat centrally located pivot axis connected by dielectric stub shaft 310 to a fixed point on a dielectric plate (not shown). The dielectric plate is fixedly mounted in a plane parallel and adjacent to the bottom edges of turns 251–254. Metal pins 312 mechanically and electrically connect adjacent pairs of leaves 301–309 together so the adjacent leaves pivot about pins 312. Adjacent pairs of leaves 301–309 have abutting spring biased planar surfaces to assist in maintaining all of the leaves at ground potential so they together serve as an r.f. shield for electromagnetic and electrostatic fields between coil 258 and plasma 50.

Rotary output shaft 314 of electromechanical drive 49, connected close to exterior edge 316 of leaf 301, responds to a signal from microprocessor 20 to turn leaf 301 about its pivot axis 310. Leaf 301 in turn drives leaf 302 through pin 312; turning of leaf 302 results in turning of leaf 303. In this manner rotation of shaft 314 turns all of leaves 301–309 to open and close the iris and vary the r.f. electric and magnetic fields coil 250 couples to plasma. The iris opening is circular for all diameters of the iris and typically has its smallest diameter about equal to the diameter of turn 222 and its largest diameter slightly in excess of the diameter of turn 224.

Iris 298 as illustrated in FIG. 3, is symmetrical with respect to central axis 256 of coil 250 so the shielding effect of the iris is symmetrical. If it is desired to skew the shielding effect so one side of coil 250 supplies a greater amount of r.f. flux to plasma 50 than another side of the coil, iris 298 can be translated in the directions of mutually orthogonal (x and y) axes by a pair of lead screws (not shown) that extend in a plane parallel to the upper face of window 46 (i.e., in approximately the same plane as leaves 301–309) and are fixedly connected to mutually orthogonal edges of the dielectric plate that carries stub shafts 310 of leaves 301–309.

While there have been described and illustrated specific embodiments of the invention, it will be clear that variations in the details of the embodiments specifically illustrated and described may be made without departing from the true spirit and scope of the invention as defined in the appended claims.

We claim:

1. A method of controlling an r.f. plasma treating one or more workpieces in a vacuum plasma processing chamber, the workpiece being on a workpiece holder, the method being performed in accordance with one of plural recipes each including a set of parameters, the parameters associated with each recipe including (a) flow rate of gas supplied to the chamber, (b) pressure in the chamber, (c) power supplied to a multi-turn excitation coil for the plasma, and (d) a function determined by a desired coupling coefficient of an r.f. field component the coil is to apply to the plasma, the method comprising processing a workpiece in accordance with a first of the recipes with the coupling coefficient adjusted so there is a first relation between r.f. field components coupled from different portions of the coil to the plasma, and thereafter processing a workpiece in accordance with a second of the recipes with the coupling coefficient adjusted so there is a second relation between r.f. field components coupled between different portions of the coil and the plasma, the coupling coefficient being adjusted by varying the spacing between different radial portions of the coil and the plasma in a direction substantially at right angles to a plane including radii of the coil.

2. A method of controlling an r.f. plasma treating one or more workpieces in a vacuum plasma processing chamber, the workpiece being on a workpiece holder, the method being performed in accordance with one of plural recipes each including a set of parameters, the parameters associated with each recipe including (a) flow rate of gas supplied to the chamber, (b) pressure in the chamber, (c) power supplied to a multi-turn excitation coil for the plasma, and (d) a function determined by a desired coupling coefficient of an r.f. field component the coil is to apply to the plasma, the method comprising processing a workpiece in accordance with a first of the recipes with the coupling coefficient adjusted so there is a first relation between r.f. field components coupled from different portions of the coil to the plasma, and thereafter processing a workpiece in accordance with a second of the recipes with the coupling coefficient adjusted so there is a second relation between r.f. field components coupled between different portions of the coil and the plasma, the coupling coefficient being adjusted by varying the amount of electric shielding between different radial portions of the coil and the plasma.

3. A method of controlling an r.f. plasma treating one or more workpieces in a vacuum plasma processing chamber, the workpiece being on a workpiece holder, the method being performed in accordance with one of plural recipes each including a set of parameters, the parameters associated with each recipe including (a) flow rate of gas supplied to the chamber, (b) pressure in the chamber, (c) power supplied to a multi-turn excitation coil for the plasma, and (d) a function determined by a desired coupling coefficient of an r.f. field component the coil is to apply to the plasma, the method comprising processing a workpiece in accordance with a first of the recipes with the coupling coefficient adjusted so there is a first relation between r.f. field components coupled from different portions of the coil to the plasma, and thereafter processing a workpiece in accordance with a second of the recipes with the coupling coefficient adjusted so there is a second relation between r.f. field components coupled between different portions of the coil and the plasma, the coupling coefficient being adjusted so there is a lower coupling coefficient between coil portions at radius $R_1$ from a center point of the coil than for coil portions at radius $R_2$, where $R_1$ is greater than $R_2$.

4. The method of claim 3 wherein the coupling coefficient is adjusted by varying the spacing between different radial portions of the coil and the plasma in a direction substantially at right angles to a plane including radii of the coil.

5. The method of claim 4 wherein the radial portions are adjusted so one side of an outer turn of the coil is farther from the window than another side of the outer turn of the coil.

6. The method of claim 3 wherein the coupling coefficient is adjusted by varying the amount of electric shielding between different radial portions of the coil and the plasma.

7. A coil for exciting an r.f. plasma in a vacuum plasma processing chamber comprising plural radially and circumferentially extending turns connected between a pair of r.f. excitation terminals, and a drive arrangement for varying r.f. field coupling coefficients between different radial and circumferential portions of the coil and the plasma.

8. The coil of claim 7 wherein the varying arrangement is arranged for driving different portions of the coil toward and away from the plasma to space the different coil portions by differing amounts from the plasma.

9. The coil of claim 8 wherein the varying arrangement includes plural drive shafts fixedly attached to different portions of the coil, the drive shafts being connected to the coil portions so the coil portions can have differing spacings from the plasma.

10. The coil of claim 9 wherein the portions of the coil that are connected to the shafts are relatively rigid and are mechanically and electrically connected to each other by a relatively flexible metal member.

11. The coil of claim 7 wherein the varying arrangement includes a shield having at least one moving part for intercepting a portion of an r.f. plasma excitation field derived by the coil and for reducing coupling of the intercepted field portion to the plasma, and a drive for moving the shield moving part portion relative to the coil and plasma so different positions of the shield cause different amounts of coupling of the plasma excitation field to the plasma from different portions of the coil.

12. The coil of claim 11 wherein windings of the coil are stationary relative to the shield and chamber.

13. The coil of claim 12 wherein the shield is an electric, non-magnetic conductor connected to a reference potential.

14. The coil of claim 13 wherein the shield is shaped as a member having an inner perimeter with a variable length and a center point substantially aligned with a center point of the coil, the member being coupled with the drive so the drive varies the member inner length.

15. The coil of claim 14 wherein the coil and shield are surrounded by a second shield shaped as a collar and having an outer perimeter sized and shaped approximately the same as the processing chamber outer perimeter, the second shield having an inner perimeter electrically and mechanically connected to the outer periphery of the shield having the variable inner perimeter.

16. The coil of claim 15 wherein the shield having the variable inner perimeter is shaped as a ring and is formed as an iris.

17. A plasma processor comprising a vacuum plasma processing chamber, a coil for exciting gas in the chamber to an r.f. plasma, the coil including plural radially and circumferentially extending turns connected between a pair of r.f. excitation terminals, and a drive arrangement for varying an r.f. field coupling coefficient between different radial and circumferential portions of the coil and the plasma.

18. The plasma processor of claim 17 further including a signal source for deriving a set point signal for controlling movement of the drive arrangement, and a signal coupler responsive to the signal source for activating the drive arrangement in response to the signal derived by the source.

19. The plasma processor of claim 18 further including a controller for the processor, the controller including a memory storing plural recipes for different processing steps of at least one workpiece adapted to be processed by the processor, each recipe including set points for various parameters of the processor, including set points for (a) flow rate of gas into the processor chamber, (b) vacuum pressure in the processor chamber, (c) power applied to the coil and (d) position of the drive member, the controller responding to the stored set point signals for controlling (a) flow rate of gas into the processor chamber, (b) vacuum pressure in the processor chamber, (c) power applied to the coil and (d) position of the drive member.

20. The processor of claim 17 wherein the varying arrangement is arranged for driving different portions of the coil toward and away from the plasma to space the different coil portions by differing amounts from the plasma.

21. The processor of claim 20 wherein the varying arrangement includes plural drive shafts fixedly attached to different portions of the coil, the drive shafts being connected to the coil portions so the coil portions can have differing spacings from the plasma.

22. The processor of claim 21 wherein the portions of the coil that are connected to the shafts are relatively rigid and are mechanically and electrically connected to each other by a relatively flexible metal member.

23. The processor of claim 17 wherein the varying arrangement includes a shield having at least one moving part for intercepting a portion of an r.f. plasma excitation field derived by the coil and for reducing coupling of the intercepted field portion to the plasma, and a drive for moving the shield moving part portion relative to the coil and plasma so different positions of the shield cause different amounts of coupling of the plasma excitation field to the plasma from different portions of the coil.

24. The processor of claim 23 wherein windings of the coil are stationary relative to the shield and chamber.

25. The processor of claim 24 wherein the shield is an electric, non-magnetic conductor connected to a reference potential.

26. The processor of claim 25 wherein the shield is shaped as a member having an inner perimeter with a variable length and a center point substantially aligned with a center point of the coil, the member being coupled with the drive so the drive varies the member inner length.

27. The processor of claim 26 wherein the coil and shield are surrounded by a second shield shaped as a collar and having an outer perimeter sized and shaped approximately the same as the processing chamber outer perimeter, the second shield having an inner perimeter electrically and mechanically connected to the outer periphery of the shield having the variable inner perimeter.

28. The processor of claim 27 wherein the shield having the variable inner perimeter is shaped as a ring and is formed as an iris.

\* \* \* \* \*